(12) United States Patent
Nakamura (10) Patent No.: US 6,483,691 B1
(45) Date of Patent: Nov. 19, 2002

(54) CAPACITOR AND METHOD FOR MANUFACTURING THE SAME

(75) Inventor: Takashi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/890,252
(22) PCT Filed: Feb. 3, 2000
(86) PCT No.: PCT/JP00/00597
§ 371 (c)(1), (2), (4) Date: Aug. 3, 2001
(87) PCT Pub. No.: WO00/46856
PCT Pub. Date: Aug. 10, 2000

(30) Foreign Application Priority Data

Feb. 4, 1999 (JP) .......................................... 11-027929
Sep. 28, 1999 (JP) .......................................... 11-275296

(51) Int. Cl.⁷ ............................................... H01G 4/005
(52) U.S. Cl. ................. 361/303; 361/321.1; 361/306.1; 361/311; 438/240; 438/250; 257/295
(58) Field of Search .............................. 361/303, 306.1, 361/301.2, 311, 312, 313, 321.1, 321.3, 320, 321.4, 321.5; 438/240, 250; 257/295

(56) References Cited

U.S. PATENT DOCUMENTS

| | | | | |
|---|---|---|---|---|
| 5,335,138 A | * | 8/1994 | Sandhu et al. | 361/303 |
| 5,349,494 A | * | 9/1994 | Ando | 361/322 |
| 5,452,178 A | * | 9/1995 | Emesh et al. | 361/303 |
| 5,572,052 A | * | 11/1996 | Kashihara et al. | 257/295 |
| 5,638,319 A | | 6/1997 | Onishi et al. | 365/145 |
| 5,645,976 A | * | 7/1997 | Azuma | 430/313 |
| 5,668,040 A | | 9/1997 | Byun | 438/396 |
| 5,729,054 A | | 3/1998 | Summerfelt et al. | 257/751 |
| 5,812,364 A | * | 9/1998 | Oku et al. | 361/312 |
| 5,844,771 A | * | 12/1998 | Graettinger et al. | 361/303 |
| 5,858,851 A | | 1/1999 | Yamagata et al. | 438/396 |
| 5,892,254 A | | 4/1999 | Park et al. | 257/295 |
| 5,978,207 A | * | 11/1999 | Anderson et al. | 361/311 |
| 6,025,223 A | * | 2/2000 | Park | 438/240 |

FOREIGN PATENT DOCUMENTS

| | | |
|---|---|---|
| DE | 196 40 246 A1 | 4/1998 |
| EP | 0 697 717 A | 2/1996 |
| JP | 07-169854 | 7/1995 |
| JP | 08-335682 | 12/1996 |
| JP | 09-055497 | 9/1997 |
| JP | 09-293838 | 11/1997 |
| JP | 11-027929 | 2/1999 |

\* cited by examiner

Primary Examiner—Dean A. Reichard
Assistant Examiner—Nguyen Ha
(74) Attorney, Agent, or Firm—Arent Fox Kintner Plotkin & Kahn (57) ABSTRACT

A lower electrode (4), a dielectric layer (5) made of a ferroelectric material or a high dielectric constant material, and an upper electrode (6) are formed in order on an insulating film (2). The dielectric layer (5) is formed to extend off the lower electrode (4). Between the portion of the dielectric layer (5) at which the dielectric layer is extending off the lower electrode and the insulating film (2), an insulation barrier layer (3) made of a composite metallic oxide including at least two metals containing a Si or a silicon nitride compound is interposed. In another mode, a plug for contact is provided in an insulating film, and an adhesion layer is provided between the plug and the lower electrode. An insulation barrier layer made of an oxide of the same material forming the adhesion layer is provided between the dielectric layer and the insulating film. As a result, Ti and Pb, which are constitutive elements of the ferroelectric material or high dielectric constant material do not diffuse and enter into an $SiO_2$ film and a semiconductor layer, enabling easy formation of a barrier layer.

12 Claims, 6 Drawing Sheets

CAPACITOR AND METHOD FOR MANUFACTURING THE SAME

FIELD OF THE INVENTION

The present invention relates to a capacitor and a method for manufacturing the same wherein a dielectric layer is made of ferroelectric material or a material of high dielectric constant and which is formed on an insulating film on a surface of a substrate. More particularly, it relates to a capacitor capable of preventing dispersion of the metallic component(s) of the dielectric material into the insulating film or a semiconductor layer or preventing occurrence of cracks in the dielectric material, by patterning a lower electrode and by making the dielectric layer of the capacitor directly contact with the insulating film, and which is further capable of preventing influences of adhesion of the electrode or interdiffusion also in case the electrode is electrically connected to the semiconductor layer via the plug within the contact hole formed in the insulating film.

BACKGROUND ART

Figure 8:
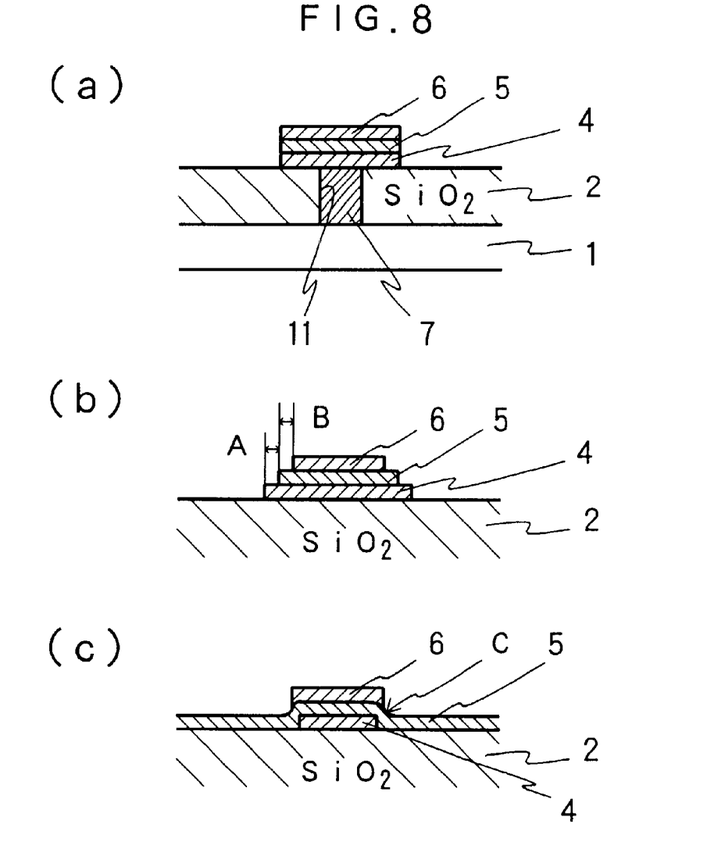
FIG. 8 is a view illustrating examples of a structure of a conventional capacitor.

In forming a plurality of dielectric capacitors on a same substrate such as a semiconductor substrate, it is necessary to perform patterning of a formed electrode or a dielectric layer. It is possible to employ a method as illustrated in FIG. 8(a) in which an upper electrode 6, a dielectric layer 5 and a lower electrode 4 are processed in a lump. The example as illustrated in FIG. 8(a) is a sectional explanatory view of an example in which an insulating film 2 is formed on a semiconductor substrate 1, and electric connection is achieved with a semiconductor layer formed below the insulating film 2 via a plug 7 formed within a contact hole 11 formed in the insulating film 2, the plug being made of conductive layer of, for instance, poly-silicon. In this method, it is required to sequentially perform etching of the three layers by using the same mask while processing thereof is difficult in view of selection of etching conditions and others, and etching damages may be formed at side wall portions that undergo etching that will cause degradations in capacitor characteristics.

It is known for a method to perform separate patterning of the three layers of the lower electrode 4, the dielectric layer 5 and the upper electrode 6 as illustrated in FIG. 8(b) in order to avoid such etching damages. However, in performing separate patterning of the three layers, it will be required for mask alignments for each of the layers, and alignment margins A and B, which depend on alignment accuracies for forming the etching pattern, will further be required. It is therefore necessary to secure a larger area than an actual area of the capacitor and will cause an increase in cell area (chip area).

In order to solve such problems, it would be possible to employ a method as illustrated in FIG. 8(c) in which the lower electrode 4 is patterned prior to forming the dielectric layer 5, and in which the dielectric layer 5 is either refrained from etching of the dielectric layer 5 or etching thereof is performed for an area that is larger than the lower electrode 4, whereupon the upper electrode 6 is formed. Such a method will be effective in achieving smaller etching margin and less etching damages. However, since $SiO_2$ is usually used as the insulating film 2 formed on the substrate to form a base for the capacitor, the dielectric film 5 will directly contact the $SiO_2$ film in this method. This method is further disadvantaged in that a weak point (see point C) is formed on an edge portion of the lower electrode 4 at which the dielectric layer 5 is thin. In such a case, though troubles can be eliminated if patterning would be performed to make the upper electrode 6 face the lower electrode 4 to be identical in size, it may also be the case that it is used as a common plate (wiring) so that short deficiencies of both electrodes 4, 6 are apt to occur.

In case the dielectric layer of the capacitor is made of ferroelectric material or a material of high dielectric constant, Pb or Ti of the ferroelectric layer may be diffused into the $SiO_2$ film and may further be diffused into the semiconductor layer formed downward thereof upon direct contact of the ferroelectric layer with $SiO_2$ to thus cause degradations not only of the capacitor but also of element characteristics of the semiconductor elements, and it may, in some cases, cause to crack in the dielectric layer.

On the other hand, it is suggested in Japanese Patent Application Unexamined Publication No. 7-99290 (1995) that for the purpose of preventing interactive reaction, which may be caused upon contact of a ferroelectric layer of a ferroelectric capacitor with a silicon-containing layer, a titanium dioxide layer or an oxide layer of magnesium zirconium, tantalum or the like shall be formed at portions that come in contact with the ferroelectric layer. However, oxides of titanium, magnesium, zirconium, tantalum or the like exhibit extremely poor workability and thus lead to a drawback that it is difficult to perform precise patterning owing to time-consuming processing through dry etching or adhesion of liberated heavy metal, which is a constitutive element thereof, on the surface exposed by etching. It is thus of disadvantage that they cannot be used particularly for the case as illustrated in FIG. 8(a) in which a contact hole is formed in the insulating film on which the capacitor is to be formed for electric connection with a plug formed therein.

When manufacturing a ferroelectric capacitor in which the lower electrode is connected to the semiconductor layer via the plug formed in the contact hole of the insulating film, interactive reaction may be caused between the ferroelectric layer and poly-silicon, which is a material usually used for forming the plug, to cause degradations in capacitor characteristics or degradations in element characteristics of semiconductor elements in case the lower electrode is made of Pt, which exhibits superior orientation for the ferroelectric layer, and thus makes constitutive elements such as Pb, Zr or O of the ferroelectric layer easily pass through. Moreover, adhesion between the lower electrode made of Pt, which is suitable for forming the ferroelectric film, and the plug is not necessarily favorable and may cause in worsened ohmic contact.

The present invention has been made for the purpose of solving such problems, and it is an object thereof to provide a capacitor and a method for manufacturing the same which is capable of improving workability through dry etching while preventing diffusion and immersion of constitutive elements of the ferroelectric material or material of high dielectric constant such as Ti or Pb into the $SiO_2$ film or the semiconductor layer.

It is another object of the present invention to provide a capacitor and a method for manufacturing the same that is of a structure in which weak points are hardly occurring in the dielectric layer.

It is still another object of the present invention to provide a capacitor of a structure in which preventing the interaction between the dielectric layer and the $SiO_2$ film or the semiconductor layer may be achieved while improving adhesion between the lower electrode of the capacitor and the plug formed within a contact hole of the insulating film and preventing the interaction between the dielectric layer and the plug through the lower electrode.

It is still another object of the present invention to provide a method for manufacturing a capacitor in which the oxide of high melting point metal such as Ti, Ta or Zr exhibiting high barrier effects with respect to the ferroelectric layer may be interposed between the dielectric layer made of ferroelectric or the like and the insulating film made of $SiO_2$ film or the like as a barrier layer without the necessity of patterning, also in case the lower electrode is electrically connected to the underlying layer through the contact hole.

DISCLOSURE OF THE INVENTION

The capacitor according to the present invention comprises; a lower electrode formed on a silicon oxide film, a dielectric layer formed on the lower electrode and made of ferroelectric material or a material of high dielectric constant (permittivity), and an upper electrode formed on the dielectric layer, wherein the lower electrode is patterned such that the dielectric layer is formed to extend off the lower electrode, and wherein an insulating barrier layer made of a composite metallic oxide including at least two metals containing a Si or a silicon nitride compound is interposed between a portion of the dielectric layer at which it extends off the lower electrode and the silicon oxide film.

In the description, the term "capacitor" includes, in addition to an ordinary capacitor in which a dielectric layer is sandwiched by metallic electrodes from both sides, one of a FET type structure such as a ferroelectric memory (FRAM) of MFMIS structure in which a gate electrode of a MOS transistor and the lower electrode of the capacitor are used in common. Further, the term "silicon nitride based compound" includes, besides silicon nitride, $SiO_uN_x$ ($0 \leq u$, $0 < x$, wherein u and x indicate content ratios when Si is set to be 1) in which oxygen may be contained in the silicon nitride.

With this arrangement, the insulating barrier layer will exhibit a smaller diffusion constant of elements constituting the ferroelectric such as Ti or Pb when compared to $SiO_2$ (in case of $SiO_uN_x$), or will function as a barrier for the metal of the same sort (in case of a composite metallic oxide including at least two metals), and diffusion thereof will be prevented. On the other hand, since it contains Si, it is easy to be etched and also exhibits superior workability.

It is especially preferable that the insulating barrier layer includes the above constitutive elements of the dielectric layer to function as a barrier and for preventing diffusion of the element from the dielectric layer.

It is preferable that the composite metallic oxide of the insulating barrier layer is $SiZr_yO_z$ ($0 < y$, $0 < z$, wherein y and z indicate content ratios when Si is set to be 1), $SiTi_yO_z$ ($0 < y$, $0 < z$, wherein y and z indicate content ratios when Si is set to be 1), or $SiTa_yO_z$ ($0 < y$, $0 < z$, wherein y and z indicate content ratios when Si is set to be 1), since it is possible to improve workability of dry etching while preventing diffusion of Ti or Zr of the ferroelectric.

It is preferable to form the insulating barrier layer to be substantially on the same plane as the lower electrode, since weak points will be hardly formed on the dielectric layer thereby.

According to another aspect of the capacitor of the present invention, the capacitor is comprises; a plug for connection formed in a contact hole formed in an insulating film, a lower electrode formed to be in electric connection with the plug, a dielectric layer formed on the lower electrode, an upper electrode formed on the dielectric layer, an adhesion layer made of a high melting point metal or a nitride of a high melting point metal that is interposed between the plug and the lower electrode, and an insulating barrier layer made of an oxide of the identical material to that of the adhesion layer that is interposed between a portion of the dielectric layer, which extends off the lower electrode to extend on the insulating film, and the insulating film.

With this arrangement, the adhesion layer will be interposed between the plug and the lower electrode and the insulating barrier layer will be interposed between the portion of the dielectric layer, which extends off the lower electrode to extend on the insulating film, and the insulating film, so that it is possible through both of these to prevent diffusion of constitutive element of the dielectric layer into the insulating film or the semiconductor layer. Moreover, since the insulating barrier layer is formed of an oxide of a high melting point metal, it may be formed by selective oxidation treatment of the simultaneously formed layer, and although the oxide of high melting point metal or the like is hard to be processed through etching or the like, it may be employed as an insulating barrier layer without the necessity of patterning. It will consequently act as an extremely favorable insulating barrier layer, while the adhesion layer will act as a junction layer to maintain the electric connection between the lower electrode and the plug in an extremely favorable manner.

Such effects are especially remarkable in case the dielectric layer is formed of a ferroelectric or a dielectric of high dielectric constant. The adhesion layer may be formed of the high melting point metal, a nitride of the high melting point metal or a conductor which contains further a Si in the nitride.

A method for manufacturing the capacitor of the present invention includes the steps of; (a) forming a contact hole in an insulating film on a semiconductor substrate for electric connection with an underlying layer, (b) forming a plug by filling a conductive material into the contact hole, (c) forming a conductive layer containing a high melting point metal on the plug and the insulating film, (d) forming a lower electrode by depositing an electrode material on the conductive layer and patterning the same, (e) making an adhesion layer under the lower electrode and an insulating barrier layer on an outer periphery thereof from the conductive layer, upon selective oxidation treatment of the conductive layer at the portion exposed from the lower electrode by utilizing the lower electrode as a mask, (f) forming a dielectric layer on the lower electrode to extend on the insulating barrier layer, and (g) forming an upper electrode on the dielectric layer.

By employing this method, an insulating barrier layer exhibiting superior characteristics for barricading heavy metal owing to oxide of a high melting point metal may be extremely easily be formed without patterning the contact hole portion.

The selective oxidation treatment of the conductive layer may be either performed through heat treatment in an oxygen atmosphere or through implantation of oxygen ion.

According to another aspect of a method for manufacturing the capacitor, the method includes the steps of; (a) forming an insulating barrier layer by depositing a composite metallic oxide including at least two metals containing a Si on an insulating film on a semiconductor substrate, (b) forming a contact hole through the insulating barrier layer to make the insulating film expose, (c) forming a plug by filling a conductive material into the contact hole, (d) forming a lower electrode to contact with the plug, and (e) forming a dielectric layer and an upper electrode on the lower electrode.

According to this method, etching may be easily performed, even though the capacitor is formed to contact with the plug while interposing the insulating barrier layer between the dielectric layer and the insulating film, since the insulating barrier layer contains Si, and the contact hole may be easily formed.

It is preferable to perform flattening of the surface of the dielectric layer prior to forming the upper electrode to thereby eliminate generation of weak points on the dielectric layer.

BEST MODE FOR CARRYING OUT THE INVENTION

According to a first embodiment of the capacitor of the present invention as indicated by the sectional explanatory view of the first embodiment in FIG. 1(c), an insulating barrier layer 3 made, for instance, of $SiN_x$ (e.g. $Si_3N_4$) is formed on a silicon oxide film $SiO_u$ (e.g. $SiO_2$) film 2 on, for instance, a semiconductor substrate 1 for preventing diffusion of the element from a dielectric layer 5 that is to be described later, and a lower electrode 4 patterned thereon to be of a desired size, the dielectric layer 5 that is made of a ferroelectric material or a material of high dielectric constant and that is formed to be largely extending off the lower electrode 4, and an upper electrode 6 are sequentially formed thereon. With this arrangement, this structure is characterized in that a portion at which the dielectric layer 5 is extending off the lower electrode 4 and at which no lower electrode 4 is present, the dielectric layer 5 is directly laminated onto the insulating barrier layer 3 such that the insulating barrier layer 3 is interposed between the dielectric layer 5 and the $SiO_u$ film 2 such as $SiO_2$.

The inventor of the present invention has made various studies for solving the problem of diffusion caused through the direct contact of the dielectric layer 5 and the $SiO_u$ film 2 or the problem in performing dry etching when a $TiO_2$ film or a $ZrO_2$ film is interposed between the dielectric layer 5 and the $SiO_u$ film 2, and it is found out that it is possible to perform patterning of the insulating barrier layer 3 as easily as $SiO_u$ while preventing diffusion of constitutive element of the dielectric layer 5 by interposing an insulating barrier layer 3 between the dielectric layer 5 and the $SiO_u$ film 2 wherein the layer 3 is $SiN_x$ or the like, which contains Si and has the small diffusion constant as to Pb and Ti, or wherein the layer 3 contains a metal that hinders diffusion of constitutive elements of the dielectric layer such as a composite metallic oxide including at least two metals containing Si.

The insulating barrier layer 3 may further be formed of, besides the afore-mentioned silicon nitride film ($SiN_x$) such as $Si_3N_4$, a silicon nitride based compound including, for instance, silicon oxide nitride film ($SiO_uN_x$), or a composite metallic oxide which contains Si and at least one of the constitutive elements of the dielectric layer or the elements such as Pb or Ti that functions as a barrier for preventing diffusion of the constitutive elements, for instance, $SiZr_yO_z$, $SiTi_yO_z$, or $SiTa_yO_z$. The insulating barrier layer 3 may either be formed to be a single layer or as a multiple layer made of a plurality of the above-described materials.

The dielectric layer 5 may be, in case of a capacitor for a ferroelectric memory FET or for DRAM, made of lead zirconate titanate PZT ($Pb(Zr, Ti)O_3$), lead lanthanum zirconate titanate PLZT (($Pb$, $La$) ($Zr$, $Ti$)$O_3$), SBT ($SrBi_2Ta_2O_9$) or BST (Ba, St, Ti, O) which is a material of high dielectric constant. While these dielectric material contains heavy metals that may lead to the afore-mentioned problems when diffused, diffusion of such heavy metals is prevented by the insulating barrier layer 3 in the present invention.

For forming the lower electrode 4 and the upper electrode 6, it is necessary to achieve crystallization through heat treatment in an oxygen atmosphere at a temperature as high as 650 to 850° C. after forming the above-described dielectric layer 5, so that these electrodes are made of precious metal such as Pt, Ir or Ru or oxide of such precious metal that exhibit conductivity such as iridium oxide or ruthenium oxide to prevent forming of nonconductive oxide on the surface thereof in a high temperature atmosphere and thus, to damage electric characteristics thereof. By adding Re to these precious metals, it is further possible to exhibit the advantage that patterning of the electrode may be easily performed. The physical properties of Ir are substantially identical to the physical properties of Pt. The resistivity of Ir is smaller than that of Pt, and the barrier characteristics thereof preventing oxygen and others being superior to those of Pt, it is a material favorably used for forming electrodes. The resistivity of iridium oxide being $49 \times 10^{-6} \Omega.cm$, no problems arise in employing the same as an electrode material whereby barrier characteristics of oxygen and others may be further improved in a favorable manner. It is preferable especially in a case that will be discussed later in which the lower electrode is used as a mask and an underlying high melting point metallic layer is selectively oxidized, since oxygen and others may be prevented.

A method for manufacturing a capacitor according to one embodiment of the present invention will now be explained with reference to FIGS. 1(a) to (c).

First, as illustrated in FIG. 1(a), $Si_3N_4$ is deposited onto the $SiO_2$ film 2 by using, for instance, a CVD method, whereupon the insulating barrier layer 3 is formed to be approximately 500 to 2,000 Å, and, for instance, a Pt film 4a is deposited through vacuum deposition. Then, the Pt film 4a is etched to be of a specified pattern for forming the lower electrode 4 as illustrated in FIG. 1(b). Thereafter, PZT is formed through methods such as spattering for forming the dielectric layer 5 as illustrated in FIG. 1(c), and a Pt film is formed similar to the above-described manner that is patterned for forming the upper electrode 6. Upon performing heat treatment in an oxygen atmosphere at a temperature as high as 650 to 850° C. thereafter, crystallization of the ferroelectric layer is performed. It is accordingly possible to obtain the capacitor of the structure as illustrated in FIG. 1(c).

According to the capacitor of the present invention, since $SiO_uN_x$ (0<x, wherein u may also be 0) in which Zr or Ti or the like is of small diffusion constant or a composite metallic oxide including at least two metals containing Si such as $SiZr_yO_z$ or $SiTi_yO_x$ is interposed between the dielectric layer and the silicon nitride film ($SiO_u$ film), it is possible to prevent diffusion of heavy metals owing to the fact that the diffusion constant is small or the fact that the metal such as Ti or Zr that functions as barrier for heavy metals is contained, and thus to prevent diffusion of Pb and Ti of the dielectric layer. It is consequently possible to further prevent cracks from being formed in the dielectric layer. On the other hand, since the insulating barrier layer contains Si, wherein Si is extremely reactive with $CH_4CHF_3$ that is a reactive gas for dry etching and wherein a compound thereof has a low melting point, it is possible to remove the component as it is. It is therefore possible to perform easy etching since Ti or Zr of which Si has been removed is easily separable and removable as a compound with the reactive gas. Accordingly, precise patterning may be performed.

Figure 1:
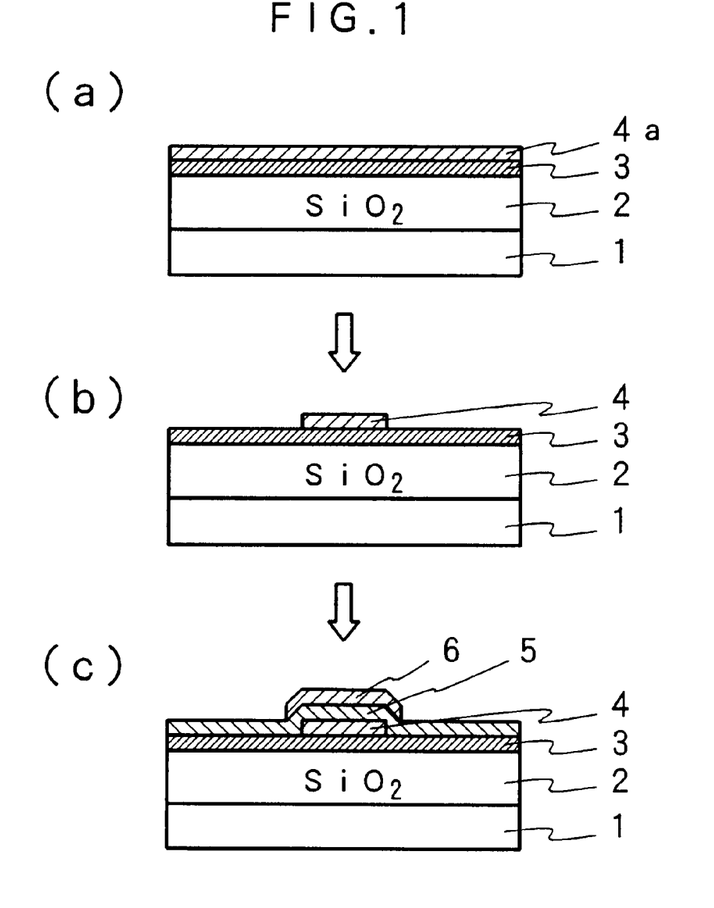
FIG. 1 is a view illustrating process for manufacturing a capacitor according to one embodiment of the present invention.
Figure 2:
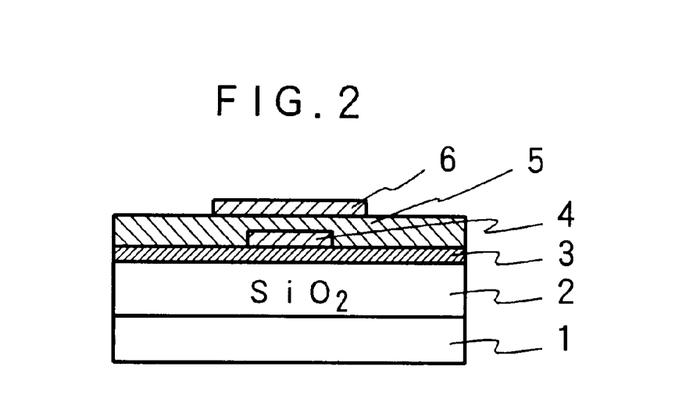
FIG. 2 is a sectional explanatory view (illustrating a modified example of the capacitor of FIG. 1.

FIG. 2 is a similar sectional explanatory view illustrating a modified example of FIG. 1 wherein the surface of the dielectric layer 5 is made to be a flat surface in this example by forming the dielectric layer 5 by using, for instance, a sol-gel method. More particularly, while the dielectric layer 5 becomes thin at edge portions of the lower electrode 4 to become weak points that may lead to contact between both upper and lower electrodes 4, 6 in the structure as illustrated in FIG. 1, the structure of FIG. 2 enables it to eliminate weak points also at edge portions of the lower electrode 4 so that such a problem may be eliminated.

For achieving such a structure, it is also possible to achieve flattening of the surface without employing the sol-gel method but by forming the dielectric layer to be thicker through methods such as spattering and to polish the surface from the surface thereof through chemical mechanical polishing (CMP). It is further possible to prevent occurrence of weak points without performing flattening of the surface of the dielectric layer 5 but by performing patterning such that the upper electrode 6 becomes smaller than the lower electrode 4.

Figure 3:
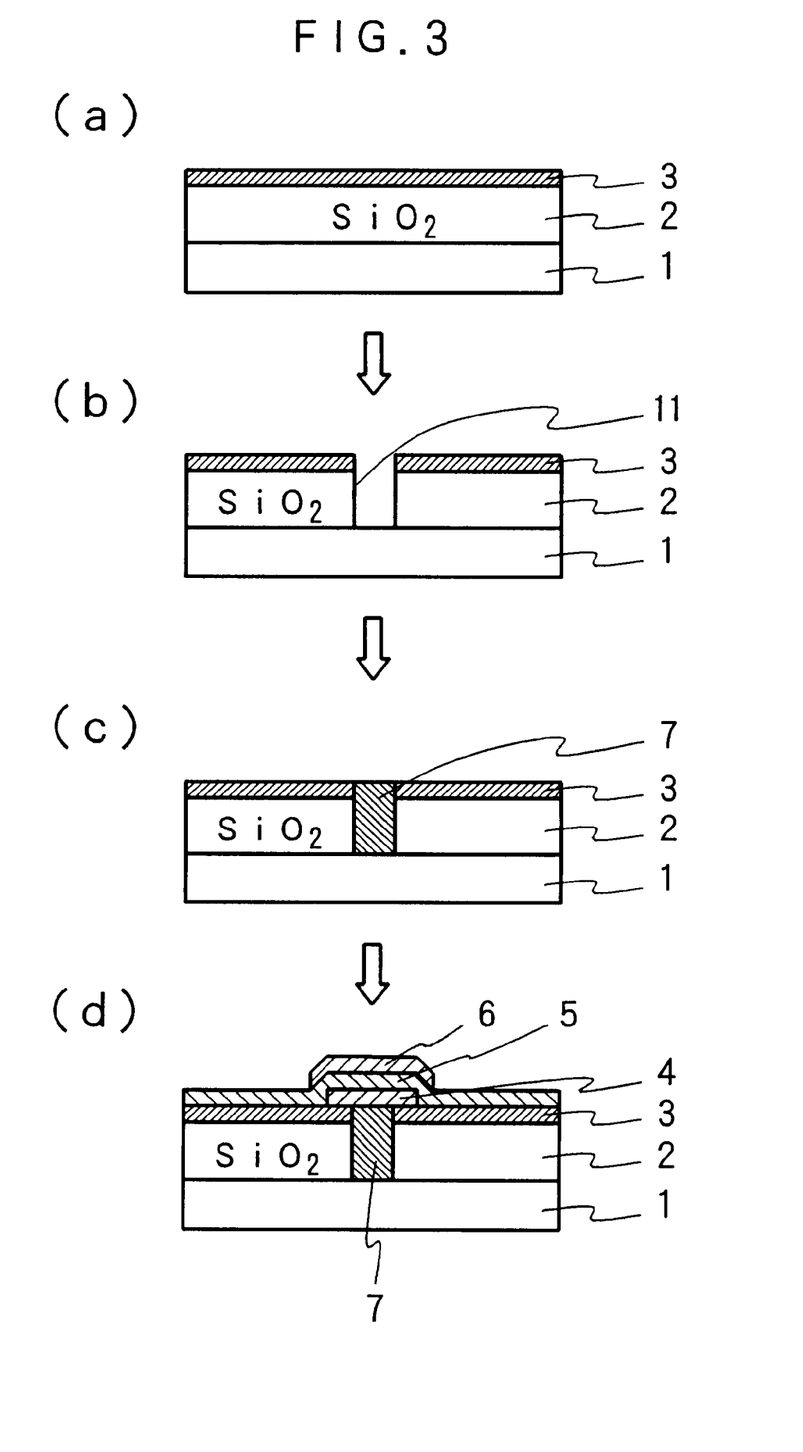
FIG. 3 is a view illustrating process for manufacturing another example of a structure for the capacitor of the present invention.

FIG. 3 is a view illustrating processes for manufacturing a capacitor according to still another embodiment of the present invention. More particularly, this is an example of a stack capacitor in which the contact hole is embedded through the plug and wherein the capacitor is formed thereon.

Similar to the above-described example, $Si_3N_4$ is deposited onto the $SiO_2$ film 2 by using, for instance, a CVD method, whereupon the insulating barrier layer 3 is formed to be approximately 500 to 2,000 Å as illustrated in FIG. 3(a). Then, the insulating barrier layer 3 and the $SiO_2$ film 2 are etched for forming the contact hole 11 as illustrated in FIG. 3(b). Thereafter, poly-silicon or W is embedded into the contact hole 11 to form the plug 7 as illustrated in FIG. 3(c). Then, similar to the example of FIG. 1, a Pt film is deposited through vacuum deposition or the like and upon etching the same to be a specified pattern, the lower electrode 4 is formed. PZT is further formed through methods such as spattering to form the dielectric layer 5, and upon performing heat treatment at high temperature after forming the upper electrode 6, crystallization of the ferroelectric layer is performed. It is thus possible to obtain the stack capacitor as illustrated in FIG. 3(d).

Figure 4:
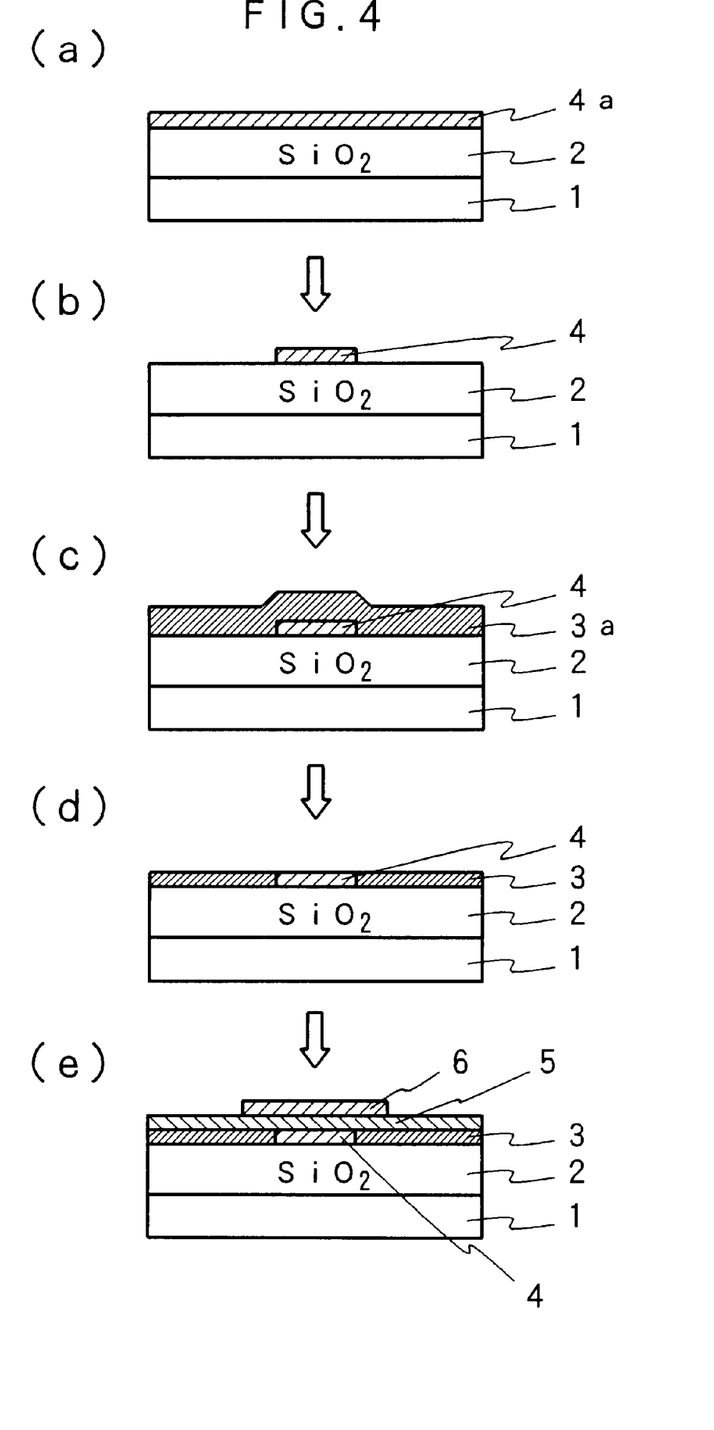
FIG. 4 is a view illustrating process for manufacturing a capacitor according to another embodiment of the present invention.

The example as illustrated in FIG. 4 is an explanatory view of another example of manufacturing capable of eliminating weak points, similar to FIG. 2. In this example, the lower electrode 4 is formed as illustrated in FIG. 4(a) by forming, for instance, a Pt film 4a onto the $SiO_2$ film 2 and by patterning the same (see FIG. 4(b)), and an insulating barrier film 3a is formed through methods such as spattering such that it becomes thicker than the lower electrode 4 (see FIG. 4(c)). The surface is then polished through CMP method to align the surface of the lower electrode 4 with the surface of the insulating barrier layer 3 (see FIG. 4(d)). The dielectric layer 5 and the upper electrode 6 are then formed similar to the above-described examples. By employing this method, it is possible to prevent occurrence of weak points in the dielectric layer 5 at edge portions of the lower electrode 4.

FIGS. 5(a) to (e) illustrate views of process for manufacturing while preventing occurrence of weak points on the dielectric layer 5 of the stack capacitor, similar to FIG. 4. Portions that are common to FIG. 3 and FIG. 4 are marked with identical reference numerals and explanations thereof will be omitted. According to this method, it is possible to obtain a stack capacitor of high reliability without weak points occurring on the dielectric layer.

According to the above inventions, since a material in which the degree of diffusion of Pb or Ti, which are constitutive elements of a ferroelectric material, is small (which diffusion constant is small) or an insulating barrier layer that functions as a barrier for preventing diffusion is provided between the dielectric layer and the silicon oxide layer, it is possible to eliminate degradations in element characteristics accompanying the diffusion or to eliminate cracks formed in the dielectric layer. On the other hand, processing such as dry etching may be easily performed since the insulating barrier layer contains Si therein. It is consequently possible to obtain a capacitor of low manufacturing costs and of high performance.

While the above-described examples were all related to a case in which the capacitor is obtained by sequentially laminating a lower electrode, a dielectric layer and an upper electrode onto a $SiO_u$ film, the same applies for a capacitor such as a ferroelectric memory FET (FRAM) in which the lower electrode is formed to concurrently serve as a gate electrode for a MOSFET and wherein the ferroelectric layer and the upper electrode are formed thereon, which is a ferroelectric memory FET of MFMIS structure.

Figure 5:
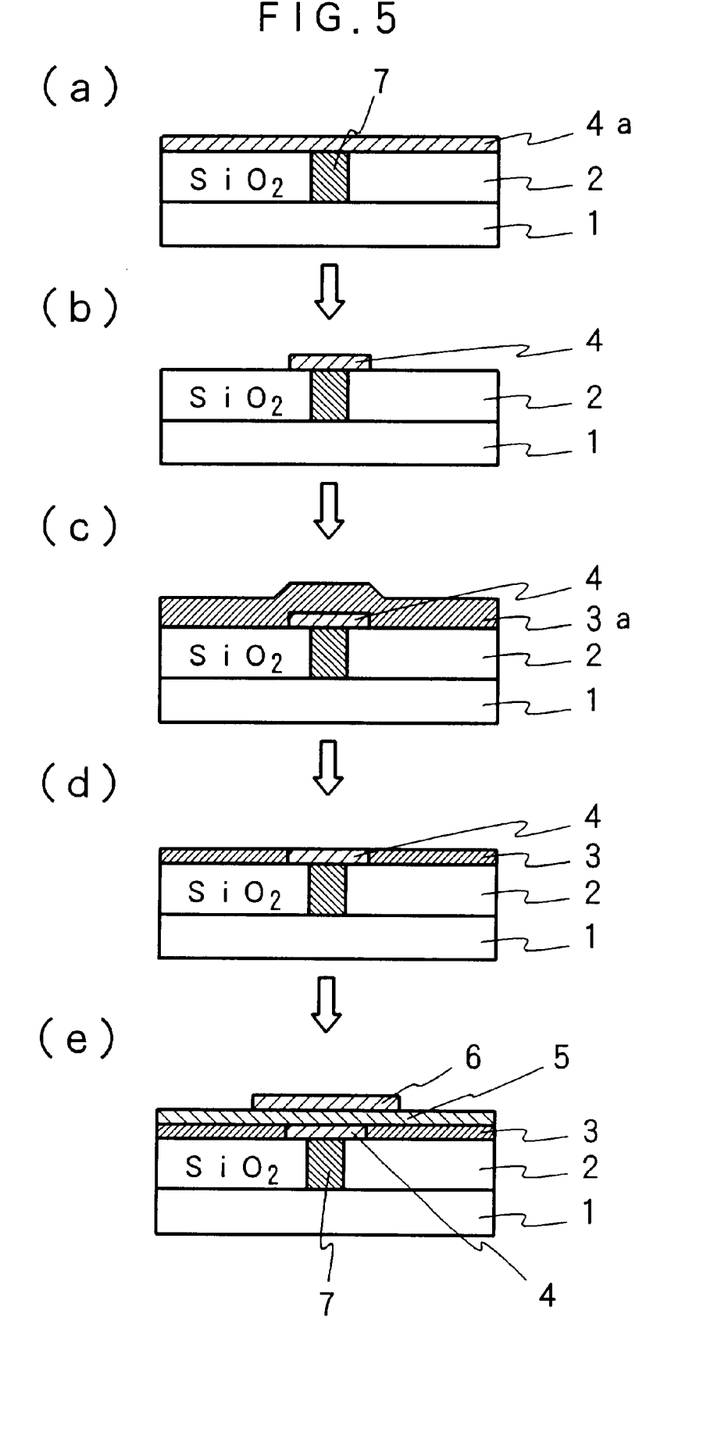
FIG. 5 is a view illustrating another example of a structure for the capacitor as illustrated in FIG. 4.
Figure 6:
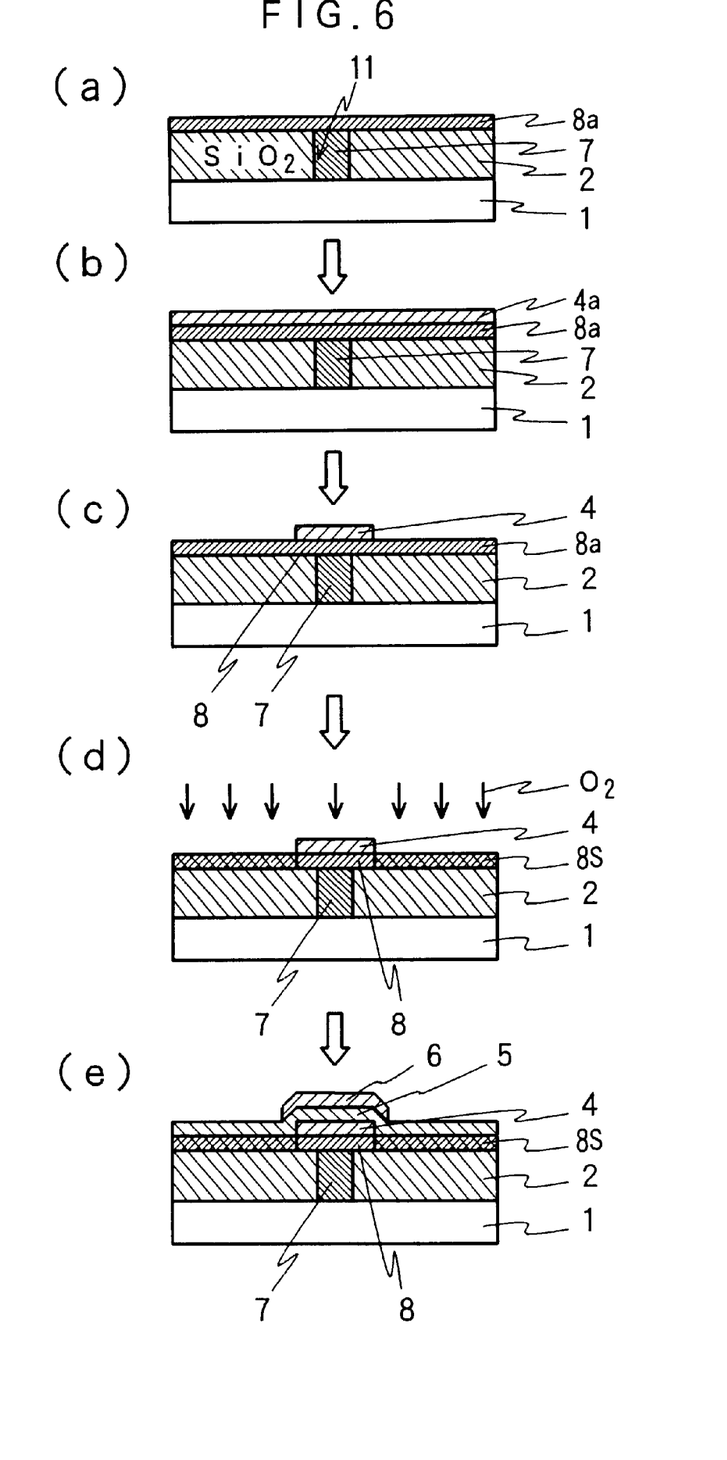
FIG. 6 is a view illustrating process for manufacturing a capacitor according to still another embodiment of the present invention.

While the above-described examples were all favorable examples in which only the insulating barrier layer was formed for preventing movements of heavy metal between the dielectric layer 5 and the insulating film 2, the above-described stack capacitors as illustrated in FIG. 3 and FIG. 5 exhibit poor adhesion between the lower electrode 4 particularly made of Pt and others and the plug that caused degradations in ohmic contact characteristics, and elements comprising the dielectric layer might diffuse to the plug 7 side via the lower electrode 4. More particularly, in case Pt or Ir (which the barrier characteristic is higher than that of Pt) is used for forming the lower electrode 4, while the orientation characteristic of the ferroelectric may be maintained in a favorable manner, constitutive elements of the dielectric layer are easy to pass through since these are pillar polycrystalline. FIG. 6 is a view for illustrating similar process for manufacturing a capacitor that is capable of solving such a problem.

As illustrated in FIG. 6(e), an adhesion layer 8 made of Ti film or the like is interposed between the lower electrode 4 and the plug 7 in this example to improve adhesion between the lower electrode 4 and the plug 7 and to prevent interdiffusion. Moreover, by utilizing high melting point metal such as Ti or Ta as the adhesion layer 8, it is possible to achieve insulation upon selective oxidation of these conductive bodies to serve as insulating barrier layer 8S instead of using the above-described insulating barrier layer 3, and the insulating barrier layer 8S is made of an oxide that is the same material as that of the adhesion layer 8. It is accordingly possible to omit patterning of contact portions and to form the insulating barrier layer 8S that exhibits strong barrier characteristic together with the adhesion layer 8 as a single layer, and it is possible to obtain a capacitor of favorable characteristics through simple manufacturing process while preventing both diffusion from the dielectric layer 5 via the lower electrode 4 and direct diffusion from the dielectric layer 5 on the insulating film 2. It should be noted that portions other than the adhesion layer 8 and the insulating barrier layer 8S are identical to those as. illustrated in the example of FIG. 1, which are thus marked with identical reference numerals and explanations thereof are omitted.

The adhesion layer 8 may be made of high melting point metal consisting of Ti, Ta, Zr, W, Nb, Cr, Mo or V, one of nitrides of such high melting point metals, or an alloy such as TaAlN or TaSiN in which these nitrides further contain Al or Si.

Since Ti exhibits favorable adhesion with Si and silicon oxide, it is possible to improve adhesion between the lower electrode or the ferroelectric layer and the under layer. More particularly, adhesion between Pt or Ir, which is a material used for forming the lower electrode 4, and Si, which is a material for forming the plug 7, or the $SiO_2$ film 2 is not favorable. While it may thus happen that partial peeling of the film or the degradation in the ferroelectric characteristic is caused, the provision of the Ti layer as the adhesion layer 8 will act as a junction layer to thereby improve the adhesion. The Ti layer further serves as a barrier layer between the polycrystalline silicon layer as the plug 7 and the lower electrode 4. When using Pt or Ir as the lower electrode 4, constitutive elements of the PZT such as O, Pb or Zr are apt to diffuse owing to the pillar polycrystalline structure thereof, while such diffusion may be particularly prevented by interposing the Ti layer so that such elements will not diffuse and no changes are found also upon deterioration with age or repetitive inversion of polarization so that it is possible to maintain favorable ferroelectric characteristic. In case the plug 7 is made of polycrystalline silicon which impurity density is high, a dopant thereof may diffuse to the lower electrode 4 side while the Ti layer is capable of preventing such diffusion as well. Moreover, by utilizing the Ti layer, peripheral portions of the lower electrode 4 may be oxidized to form a titanium oxide layer that functions as an insulating barrier layer 8S extending on the insulating film 2 for preventing diffusion from the dielectric layer 5 to the insulating film 2, and it is possible to improve adhesion besides improving ferroelectric characteristic.

Ta as well as tantalum oxide which is an oxide thereof exhibit high diffusion barrier effects and are thus characterized in that their diffusion preventing function is high.

W is of low resistance, and may be a favorable combination with polycrystalline silicon in view of adhesion or ohmic contact.

Titanium nitride is a conductor that exhibits even higher barrier.characteristic than Ti, and it is possible to prevent diffusion of impurities of the plug to the lower electrode also in case the plug is a highly doped polycrystalline silicon layer, while a titanium oxide layer exhibits effective barrier characteristic as an insulating barrier layer between the insulating film and the dielectric layer. As noted above, Ti exhibits favorable adhesion and forms TiSi upon reaction with Si to thereby improve ohmic contact characteristic. It is therefore desirable to employ a double layer structure of Ti and titanium nitride.

An alloy such as TaAlN or TaSiN in which nitride of Ti, Ta, Zr or W further contains Al or Si similarly functions as a junction layer and barrier layer and is advantaged in that favorable workability may be achieved. For instance, TaAlN, in which Al is added to TaN, is easy to be etched and is of favorable workability so that it is particularly effective when it is required to perform patterning. Since TaSiN, in which Si is added to TaN, contains silicon, it exhibits high diffusion preventing effects of Si from the silicon oxide, since it may be easily etched when compared to TaN, and since it exhibits favorable workability, it is also effective for cases in which patterning is required. Moreover, TaSiN will become a crystallite or amorphous upon addition of Si such that the barrier characteristic is further improved.

The insulating barrier layer 8S is made of an oxide of the same material as that of the above-described adhesion layer 8. More particularly, the insulating barrier layer 8S may be made of an oxide of high melting point metal such as Ti, Ta, Zr, W, Nb, Cr, Mo or V, nitride thereof or a compound in which the nitride further contains Si. All of these oxides exhibit high barrier function for preventing diffusion of Ti and Pb, which are constitutive elements of the ferroelectric material, and may prevent elements constituting the dielectric layer 5 from immersing into the insulating film 2 or the semiconductor layer 1 by being interposed between the dielectric layer 5 and the insulating film 2. Moreover, since the insulating barrier layer 8S is made of the same material as the adhesion layer 8, it is possible to simultaneously form the adhesion layer 8 also at the portion which the insulating barrier layer 8S is to be formed. And by performing the selective oxidation process, the insulating barrier layer 8S is easily formed. The barrier layer 8S is to be interposed between the dielectric layer and the insulating film without the necessity of patterning an oxide of high melting point metal that exhibits, on one hand, the favorable barrier characteristic but is, on the other hand, inferior in view of workability such as patterning.

The selective oxidation may be performed by using the lower electrode 4, which is made, for instance, of Ir or iridium oxide as a mask and to perform heat treatment of the portion exposed from the lower electrode 4 in an oxygen atmosphere. Since oxygen easily passes through Pt alone, it is not favorable for use as a mask. The oxidation film may be selectively formed in a simple manner by performing such heat treatment in the oxygen atmosphere. However, instead of the heat treatment in the oxygen atmosphere, it is also possible to perform the selective oxidation through ion implantation of oxygen by using the lower electrode 4 as a mask and to perform annealing. By using such a method, it is possible to eliminate heat treatments at high temperature, and the characteristic will not be affected also in case oxygen ion reaches a groundwork thereof (under layer) since the groundwork of a region for performing ion implantation is the insulating film. This method may thus be employed even in case the under layers include a material having a low melting point such as Al wiring.

A method for manufacturing the capacitor will now be explained based on a concrete example with reference to FIGS. 6(a) to (e). After performing thermal oxidation of a surface of a Si substrate 1 to form a SiO$_2$ film (insulating film) 2 having a film thickness of approximately 600 nm, a contact hole 11 is formed into the insulating film 2. By embedding a polycrystalline silicon layer, which has been doped at high density, into the contact hole 11, a plug 7 is formed as illustrated in FIG. 6(a). Thereafter, a Ti layer (conductive layer) 8a having a film thickness of approximately 10 to 100 nm is formed onto the entire surface of the substrate 1 through spattering method.

As illustrated in FIG. 6(b), an iridium oxide layer is then formed onto the Ti layer 8a to be of a thickness of approximately 50 nm with a target being Ir by using a mixed gas of Ar and oxygen while maintaining a vacuum condition. A Pt layer is then formed thereon to be of a thickness of approximately 200 nm by using Pt as a target, and a double layer structure 4a consisting of the iridium oxide layer and the Pt layer was formed.

Thereafter, the double layer structure 4a is then patterned through photolithographic process to form a lower electrode 4 as illustrated in FIG. 6(c). By using the lower electrode 4 as a mask for performing heat treatment for approximately 30 to 60 minutes in an oxygen atmosphere of approximately 600 to 800° C., the Ti layer 8a exposed from the pattern of the lower electrode 4 is selectively oxidized as illustrated in FIG. 6(d) to form an insulating barrier layer 8S made of titanium oxide. At this time, the Ti layer 8a below the lower electrode 4 will not be oxidized and remained as adhesion layer 8.

Thereafter, a dielectric layer 5 made of ferroelectric such as PZT was formed on the lower electrode 4 through sol-gel method. More particularly, a mixed solution of raw materials of Pb(Ch$_3$COO)$_2$.3H$_2$O, Zr(t-OC$_4$H$_9$)$_4$ and Ti(i-OC$_3$H$_7$)$_4$ is used to be spin-coated onto the above-described lower electrode 4 and the insulating barrier layer 8S, dried at approximately 150° C. and is pre-baked for approximately 30 minutes in a dry air atmosphere at approximately 400° C. Upon repeating these processes for five times, heat treatment is performed at a temperature of 700° C. in an O$_2$ atmosphere. In this manner, a dielectric layer 5 made of ferroelectric was formed to be of a thickness of approximately 250 nm. It should be noted that the value for v of PbZr$_y$Ti$_{1-y}$O$_3$ was set to be 0.52 for forming the PZT film.

A laminated film of iridium oxide and Ir was formed onto the dielectric layer 5 through spattering, and upon patterning, the upper electrode 6 is formed as illustrated in FIG. 6(e). Here, the layers are formed such that the total thickness of both the Ir layer and the iridium oxide layer is approximately 200 nm. The capacitor of a structure as illustrated in FIG. 6(e) is thus obtained.

Figure 7:
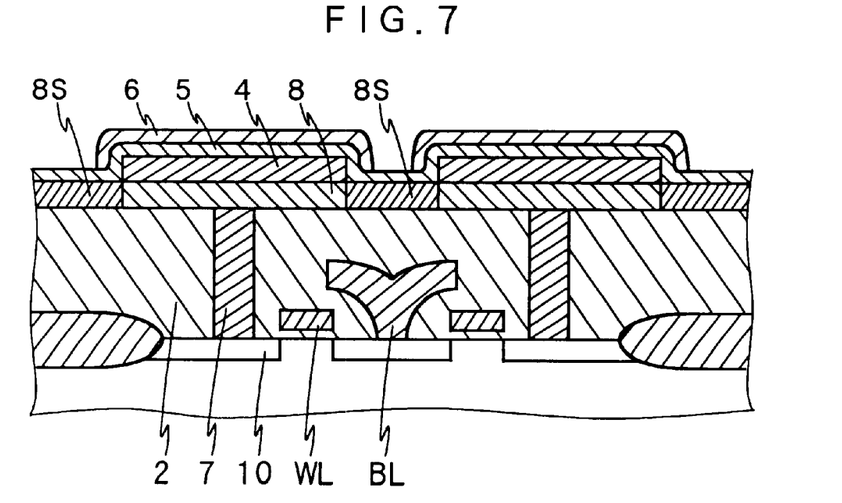
FIG. 7 is a view illustrating a memory employing a ferroelectric capacitor.

The capacitor is formed on the insulating film 2 that is provided to cover the surface of the substrate 1 such that either one of a source/drain region 10 of a MOSFET, as exemplarily illustrated in FIG. 7, is connected to the lower electrode 4 via the plug 7. It should be noted that WL indicates a word line in which the gate electrode formed on the surface of the semiconductor substrate 1 is connected via the gate insulating film and BL a bit line.

With this arrangement, the adhesion layer 8 made of Ti is interposed between the plug 7 and the lower electrode 4 while the insulating barrier layer 8S made of titanium oxide is interposed between the dielectric layer 5 and the insulating film 2. Favorable adhesion between the plug 7 and the lower electrode 4 can thus be achieved so that these members contact at low resistance, and since no interdiffusion of constitutive elements will be caused between the dielectric layer 5 and the plug 7, respective characteristics will not be degraded. The insulating barrier layer 8S further functions to prevent diffusion of constitutive elements of the dielectric layer 5 to the insulating film or the semiconductor layer so as to prevent degradations of element characteristics of the semiconductor element. It is consequently possible to obtain a ferroelectric capacitor of high reliability. On the other hand, since the insulating barrier layer 8S may be formed by only performing selective oxidation of a conductive layer that has been formed simultaneously with the adhesion layer 8, it may be extremely simply formed with no need to perform processing, though being made of high melting point metallic oxide exhibiting poor workability.

While the dielectric layer 5 of the above example is a ferroelectric film made of PZT, the same applies also in case of using ferroelectric of SBT or dielectric of high dielectric constant of BST.

According to the invention as illustrated in FIG. 6, it is possible to obtain a capacitor that can be easily manufactured, and in which it is possible to achieve a fine structure and high integration and that has high reliability. It is further possible to improve adhesion between the lower electrode and the plug, to prevent interdiffusion between the dielectric layer and the plug via the lower electrode, to form the insulating barrier layer, which is to prevent diffusion between the dielectric layer and the insulating film, of an oxide of high melting point metal exhibiting large barrier function, and to maintain characteristic of the ferroelectric in a favorable manner for a long period. It is thus possible to obtain a ferroelectric capacitor in which the deterioration with age and the degradation owing to the polarization inversion are hardly found.

INDUSTRIAL APPLICABILITY

According to the present invention, it is possible to manufacture a small sized and high performance semiconductor device including a capacitor made of ferroelectric or dielectric with high dielectric constant to be applicable to ferroelectric memories or DRAMs (Dynamic Random Access Memories) and thus to contribute to make computers exhibit even higher performances.

What is claimed is:

1. A capacitor comprising:
   a lower electrode formed on a silicon oxide film,
   a dielectric layer formed on said lower electrode and made of a ferroelectric material or a material of high dielectric constant, and
   an upper electrode formed on said dielectric layer,
   wherein said lower electrode is patterned such that said dielectric layer is formed to extend beyond sides of said lower electrode, and wherein an insulating layer made of a composite metallic oxide including at least two metals containing a Si is interposed between a portion of said dielectric layer at which it extends beyond sides of said lower electrode and said silicon oxide film.

2. The capacitor as claimed in claim 1, wherein said insulating barrier layer contains a constitutive element of said dielectric layer.

3. The capacitor as claimed in claim 1, wherein said composite metallic oxide is SiZr$_y$O$_z$ (0<y, 0<z, wherein y and z indicate content ratios when Si is set to be 1), SiTi$_y$O$_z$ (0<y, 0<z, wherein y and z indicate content ratios when Si is set to be 1), or SiTa$_y$O$_z$ (0<y, 0<z, wherein y and z indicate content ratios when Si is set to be 1).

4. The capacitor as claimed in claim 1, wherein said insulating barrier layer is formed to be substantially on the same plane as said lower electrode.

5. A capacitor comprising:

a plug for connection formed in a contact hole formed in an insulating film, a lower electrode formed to be in electric connection with said plug, a dielectric layer formed on said lower electrode, an upper electrode formed on said dielectric layer, an adhesion layer that is interposed between said plug and said lower electrode, and an insulating barrier layer made of an oxide of the identical material to that of said adhesion layer that is interposed between a portion of said dielectric layer, which extends beyond sides of said lower electrode to extend on said insulating film.

6. The capacitor as claimed in claim 5, wherein said dielectric layer is made of a ferroelectric or a dielectric of high dielectric constant.

7. The capacitor as claimed in claim 5, wherein said adhesion layer is made of a high melting point metal, a nitride of a high melting point metal, or a conductor which contains further a Si in said nitride.

8. A method for manufacturing a capacitor, comprising the steps of:

(a) forming a contact hole in an insulating film on a semiconductor substrate for electric connection with an underlying layer, (b) forming a plug by filling a conductive material into said contact hole, (c) forming a conductive layer containing a high melting point metal on said plug and said insulating film, (d) forming a lower electrode by depositing an electrode material on said conductive layer and patterning the same, (e) making an adhesion layer under said lower electrode and an insulating barrier layer on an outer periphery of said lower electrode, from said conductive layer, upon selective oxidation treatment of said conductive layer at the portion exposed from said lower electrode by utilizing said lower electrode as a mask, (f) forming a dielectric layer on said lower electrode to extend on said insulating barrier layer, and (g) forming an upper electrode on said dielectric layer.

9. The method for manufacturing as claimed in claim 8, wherein said selective oxidation treatment of said conductive layer is performed through heat treatment in an oxygen atmosphere.

10. The method for manufacturing as claimed in claim 8, wherein said selective oxidation treatment of said conductive layer is performed through implantation of oxygen ion.

11. A method for manufacturing a capacitor, comprising the steps of:

(a) forming an insulating barrier layer by depositing a composite metallic oxide including at least two metals containing a Si on an insulating film on a semiconductor substrate, (b) forming a contact hole through said insulating barrier layer to make said insulating film expose, (c) forming a plug by filling a conductive material into said contact hole, (d) forming a lower electrode to contact with said plug, and (e) forming a dielectric layer and an upper electrode on said lower electrode.

12. The method for manufacturing as claimed in claim 11, wherein flattening treatment of the surface of said dielectric layer is performed prior to forming said upper electrode.

* * * * *